United States Patent [19]

Staab

[11] Patent Number: 5,451,883
[45] Date of Patent: Sep. 19, 1995

[54] SPRING PROBE CONTACTOR WITH DEVICE STOP FOR TESTING PGA DEVICES AND METHOD THEREFOR

[75] Inventor: Craig C. Staab, Mesa, Ariz.

[73] Assignee: VLSI, San Jose, Calif.

[21] Appl. No.: 224,618

[22] Filed: Apr. 7, 1994

[51] Int. Cl.⁶ .............................................. G01R 1/04
[52] U.S. Cl. ................................... 324/758; 437/207; 174/207
[58] Field of Search ............................... 324/756–772; 437/207; 174/207

[56] References Cited

U.S. PATENT DOCUMENTS 4,965,227 10/1990 Chang et al. ....................... 437/207

Primary Examiner—Kenneth A. Wieder
Assistant Examiner—Barry C. Bowser
Attorney, Agent, or Firm—Harry M. Weiss

[57] ABSTRACT

A spring probe (pogo pin) contactor for testing PGA (Pin Grid Array) devices that limits compression of pogo pins within the spring probe contactor is disclosed. A PGA device has a plurality of device pins extending therefrom for insertion into the spring probe contactor in order to test the PGA device. At least one device pin of the plurality of device pins is provided with a widened annular portion expanding from a portion of the one device pin. A surface of the spring probe contactor has an array of apertures for receiving each device pin of the plurality of device pins of the PGA device in order to make contact with and compress the pogo pins. A cavity is coupled to the surface of the spring probe contactor which corresponds to and mates with the widened annular portion of the one device pin in order to limit an amount of insertion of the PGA device, thereby limiting the compression of the pogo pins. Although a single pin having the widened annular portion in combination with the cavity is sufficient for limiting the compression of the pogo pins, a four pin and four cavity arrangement, as well as other arrangements are possible.

13 Claims, 1 Drawing Sheet

SPRING PROBE CONTACTOR WITH DEVICE STOP FOR TESTING PGA DEVICES AND METHOD THEREFOR

BACKGROUND OF THE INVENTION

1. Field of the Invention

This invention relates generally to devices for testing electronic components and, more specifically, to a spring probe (pogo pin) contactor device for testing PGA (Programmed Grid Array) devices and method therefor that limits compression of pogo pins within the spring probe contactor.

2. Description of the Related Art

A PGA device, like other electronic devices, requires testing to ensure high quality of the finished product. In the past, in order to test a PGA device, the extending pins of the PGA device were inserted into a contactor, and the contactor was coupled to a DUT (Device Under Test) board which was coupled to the testing machine. The DUT board was, essentially, a printed circuit board that completed the electrical circuit between the PGA device pins via the contactor and the testing machine. In general, in order to test a PGA device, the testing machine would send signals to and receive signals from the PGA device via the electrical conductor paths provided by the contactor and the DUT board.

The contactor usually contains a plurality of spring probes which are sometimes referred to as pogo pins, and therefore, these types of contactors are referred to as spring probe contactors. Double ended spring probes, hereinafter referred to as spring probes or pogo pins, are well known in the art, and they typically provide a shaft with a compressible portion at both ends of the shaft. Thus, when a plurality of spring probes located within a contactor are compressed by the insertion of a plurality of PGA device pins into the contactor, these spring probes provide electrical contact between each of the pins of the PGA device and the different electrical contact points on the DUT board.

A problem of major concern with this approach has been the overdriving of the PGA devices being inserted into the spring probe contactor. Oftentimes, when an automatic handler inserts the PGA device into the spring probe contactor, the handler overdrives the insertion of the PGA device which results in the overcompression of many of the spring probes located in the spring probe contactor. In fact, in many cases, the flexible ends of the spring probes are compressed to the point that they get stuck in the shaft of the spring probes, thereby resulting in a complete loss of flexibility for the overcompressed spring probes and a resultant loss of electrical continuity. Replacing damaged spring probes in the spring probe contactor is a timely process, and, in addition, it is an expensive one based upon the high cost of replacing spring probes.

Therefore, there existed a need to provide a spring probe contactor having a device stop which limits the compression of the spring probes in the contactor when the pins of a PGA device are inserted therein for testing purposes.

SUMMARY OF THE INVENTION

In accordance with one embodiment of this invention, it is an object of this invention to provide a spring probe contactor having a device stop for limiting the compression of spring probes located therein upon the insertion of PGA device pins for testing the PGA device.

It is a further object of this invention to provide a method of testing PGA devices in a spring probe contactor without damaging spring probes located in the spring probe contactor.

BRIEF DESCRIPTION OF THE PREFERRED EMBODIMENTS

In accordance with one embodiment of this invention, a spring probe contactor for testing PGA (Pin Grid Array) devices that limits compression of pogo pins within the spring probe contactor device is disclosed comprising, in combination, a PGA device having a plurality of device pin means extending therefrom for insertion into the spring probe contactor in order to test the PGA device, and having at least one device pin of the plurality of device pin means provided with a widened annular portion expanding from a portion of the one device pin, a surface of the spring probe contactor having an array of apertures for receiving each device pin of the plurality of device pin means of the PGA device in order to make contact with and compress the pogo pins, and retaining means coupled to the surface of the spring probe contactor and comprising a cavity which corresponds to and mates with the widened annular portion of the one device pin in order to limit an amount of insertion of the PGA device, thereby limiting the compression of the pogo pins. A PGA device is provided with the widened annular portion expanding from a portion of each of four device pins of the plurality of device pin means, and the four device pins are located in proximity to each of four corners of the PGA device. In addition, the PGA device provides a fixed distance between the widened annular portion expanding from the portion of the one device pin and a distal end of the one device pin. The cavity comprises a first cylindrical portion defined by a first diameter and a first depth and comprises a second cylindrical portion defined by a second diameter and a second depth, the first cylindrical portion being above the second cylindrical portion, the first diameter being larger than the second diameter, and the first depth being smaller than the second depth. Moreover, the first diameter and the first depth of the first cylindrical portion permit insertion of the widened annular portion of the one device pin and the distal end of the one device pin and the second diameter of the second cylindrical portion stops insertion of the widened annular portion of the one device pin and the distal end of the one device pin while the distal end of the one device pin extends into the second cylindrical portion in order to compress a pogo pin. The first depth of the first cylindrical portion is selected in order to limit the compression of the pogo pins to less than 75% of a fully compressed condition.

In accordance with another embodiment of this invention, a method for testing PGA (Pin Grid Array) devices using a spring probe contactor that limits compression of pogo pins within the spring probe contactor is provided comprising the steps of inserting a PGA device having a plurality of device pin means extending therefrom into a plurality of apertures in the spring probe contactor in order to make contact with and compress the pogo pins for testing the PGA device, and the PGA device having at least one device pin of the plurality of device pin means provided with a widened annular portion expanding from a portion of the one device pin, limiting the inserting of the PGA device with a cavity in the spring probe contactor, the cavity corresponding to and mating with the widened annular portion of the one device pin in order to suppress an amount of insertion of the PGA device, thereby limiting the compression of the pogo pins.

In accordance with another embodiment of this invention, a spring probe contactor for testing PGA (Pin Grid Array) devices that limits compression of pogo pins within the spring probe contactor is disclosed comprising, in combination, a PGA device having a plurality of device pin means extending therefrom for insertion into the spring probe contactor in order to test the PGA device, and having each of four device pins of the plurality of device pin means providing a widened annular portion expanding from a portion of each of the four device pins, the four device pins being located in proximity to each of four corners of the PGA device, the PGA device providing a fixed distance between the widened annular portion expanding from the portion of each of the four device pins and a distal end of each of the four device pins, a surface of the spring probe contactor having an array of apertures for receiving each device pin of the plurality of device pin means of the PGA device in order to make contact with and compress the pogo pins, retaining means coupled to the surface of the spring probe contactor and comprising four cavities which correspond to and mate with the widened annular portion of the four device pins in order to limit an amount of insertion of the PGA device, thereby limiting the compression of the pogo pins, the four cavities each comprising a first cylindrical portion defined by a first diameter and a first depth and comprising a second cylindrical portion defined by a second diameter and a second depth, the first cylindrical portion being above the second cylindrical portion, the first diameter being larger than the second diameter, and the first depth being smaller than the second depth, and the first diameter and the first depth of the first cylindrical portion of each of the four cavities permit insertion of the widened annular portion and the distal end of each of the four device pins and the second diameter of the second cylindrical portion of each of the four cavities stops insertion of the widened annular portion and the distal end of each of the four device pins while the distal end of each of the four device pins extends into the second cylindrical portion in order to compress a pogo pin, the pogo pin being compressed less than 75% of a fully compressed condition for the pogo pin.

The foregoing and other objects, features, and advantages of the invention will be apparent from the following, more particular, description of the preferred embodiments of the invention, as illustrated in the accompanying drawings.

DESCRIPTION OF THE PREFERRED EMBODIMENTS

Figure 1:
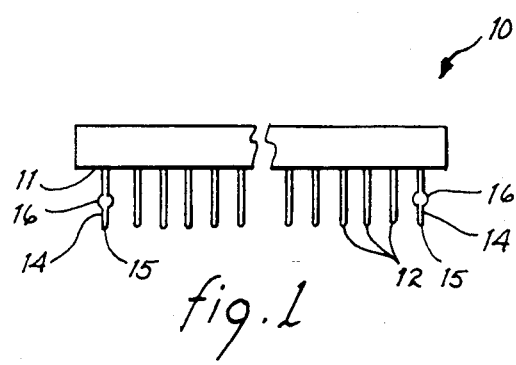
FIG. 1 is a side elevational view of a portion of a PGA device having widened annular portions extending from a portion of a plurality of device pins extending from the PGA device.

Referring to FIG. 1, a PGA device is shown and is generally designated by reference number 10. PGA devices 10 are well known to those skilled in the semiconductor manufacturing art. PGA device 10 has a plurality of device pins 12 and 14 extending from a bottom side 11 thereof. A view of the bottom side 11 of the PGA device 10 would show an array of device pins 12 and 14 that corresponds to the general shape of the array formed by the apertures 22 and the cavities 24 shown in the top surface 18 of the spring probe contactor 17 of FIG. 2, however, it is not necessary that the number of device pins 12 and 14 is equal to the number of apertures 22 and cavities 24, respectively. Note that in an alternative embodiment, a larger top surface 18 could accommodate a larger number of apertures 22 and cavities 24 such that a PGA device 10 having a greater number of device pins 12 and 14 could be inserted therein. Also note that a PGA device 10 having fewer total device pins 12 and 14 than the sum of apertures 22 and cavities 24 in the spring probe contactor 17 can be used with the spring probe contactor 17. In other words, it is not necessary that there be a one to one correspondence between every aperture 22 and cavity 24 of the spring probe contactor 17 with the device pins 12 and 14, respectively, of a PGA device 10. As a result, different PGA devices 10 having different numbers of device pins 12 and 14 can be used with the same spring probe contactor 17 as long as the total number of device pins 12 and 14 does not exceed the total number of apertures 22 and cavities 24 in the spring probe contactor 17.

The device pins 14 are similar to the device pins 12 with the exception that the device pins 14 are provided with a widened annular portion 16 which is sometimes referred to as a standoff by those skilled in the semiconductor manufacturing art. One of a total of four standoffs 16 are usually found at each of the corners of the array of device pins 12 and 14 which turn out, typically, to be in proximity to the four corners of the PGA device 10 itself. In addition, standoffs 16 are used, in part, as a guide when the leads of the PGA device 10 are cut in order to form device pins 12 and 14. The widened annular portion or standoff 16 extends from a portion of the shaft of a device pin 14, and typically the distance between the standoff 16 and a distal end 15 of the device pin 14 is a fixed quantity while the distance between the standoff 16 and bottom side 11 of the PGA device 10 is not necessarily a fixed dimension. The standoffs 16 of the PGA device 10 are used in conjunction with the cavities 24 of the spring probe contactor 17, which function as a countersink, in order to stop the insertion of the PGA device 10 when the standoffs 16 make contact with the bottom of the cavities 24, thereby limiting the compression of the pogo pins 42 (see FIG. 5) in the spring probe contactor 17.

Figure 2:
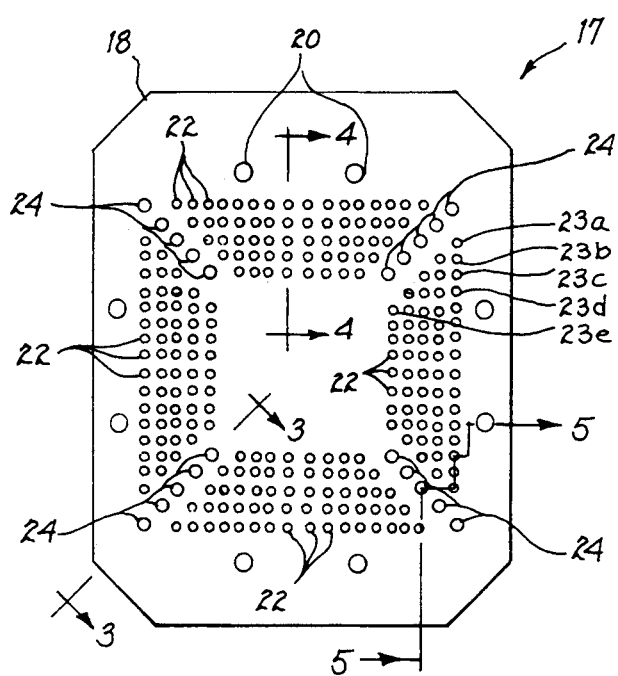
FIG. 2 is a plan view of the top surface of the spring probe contactor showing an array of apertures for receiving the device pins extending from the PGA device.
Figure 5:
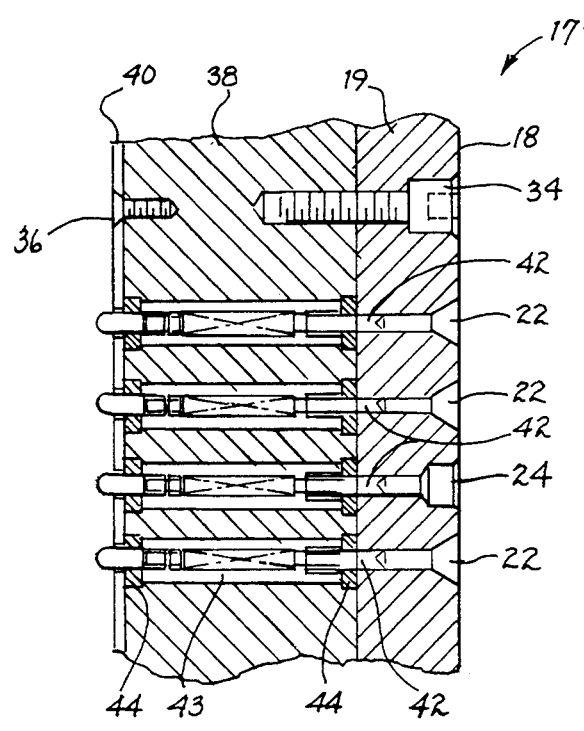
FIG. 5 is a cross sectional view of FIG. 2 taken along the line 5—5 which shows an upper, middle and lower plate of the spring probe contactor having a plurality of pogo pins therein.

Referring to FIG. 2, a plan view of the top surface 18 of the spring probe contactor 17 is shown. The spring probe contactor 17 actually includes three plates 19, 38, and 40 which are shown in FIG. 5. Bolt holes 20 are provided in plate 19 to permit coupling plate 19 to plate 38 via bolts 34. The plate 19 is also provided with a plurality of apertures 22 for receiving the device pins 12 and a plurality of cavities 24 for receiving device pins 14 having standoffs 16. Note that the diameter of each of the cavities 24 is larger than the diameter of each of the apertures 22 because the cavities 24 are designed to permit the insertion of the device pins 14 having the standoff 16 which is wider than the device pins 12. The cavities 24 are located in proximity to the corners of the spring probe contactor 17, and more particularly, the pattern of apertures 22 and cavities 24 shown in FIG. 2 forms a plurality of concentric quadrilateral polygons, such as squares 23a–23e. For each square 23a–23e, the corners thereof are the cavities 24, and the remainder of each of the squares 23a–23e are the apertures 22. Again, the presentation of apertures 22 and cavities 24 shown in FIG. 2 is meant to exemplify a preferred embodiment, however, different numbers of apertures 22 and cavities 24 are possible and different patterns of apertures 22 and cavities 24, such as a series of concentric rectangular shapes are possible. Regardless of the numbers of apertures 22 and cavities 24 used and the shape that they comprise, it is necessary to provide at least one cavity 24 that is used in conjunction with at least one corresponding device pin 14 having a standoff 16.

Figure 3:
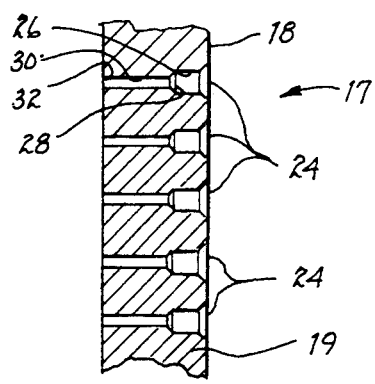
FIG. 3 is a cross sectional view of FIG. 2 taken along the line 3—3 which shows a plurality of cavities within an upper portion of the spring probe contactor; any of these cavities may correspond to and mate with the widened annular portion of certain device pins of a PGA device in order to limit the amount of insertion of these device pins of a PGA device into the spring probe contactor.

Referring to FIG. 3, a cross section of a plurality of the cavities 24 is shown. Note that no pogo pins 42 are shown in FIG. 3 for simplicity. The plate 19 having surface 18 of the spring probe contactor 17 is shown to have portions of the cavities 24 therein. Each cavity 24 is comprised of an upper cylindrical portion defined by a first diameter 28 and a first depth 26, and a lower cylindrical portion defined by a second diameter 32 and a second depth 30. Note that the first diameter 28 is larger than the second diameter 32, and the first depth 26 is less than the second depth 30. In this manner, the upper cylindrical portion permits the insertion of a device pin 14 having standoff 16, and the smaller diameter 32 of the lower cylindrical portion will not permit the insertion of the standoff 16. By selection of an appropriate first depth 26, the amount of insertion of a device pin 14 having standoff 16 is controlled. Note however that even when a device pin 14 having standoff 16 is stopped by making contact with the standoff 16 against the bottom of the upper cylindrical portion, the distal end 15 of the device pin 14 extends into the lower cylindrical portion in order to make contact with and compress a pogo pin 42. Consequently, by selecting an appropriate first depth 26, one controls the amount of insertion of the device pins 14 directly and the amount of insertion of the device pins 12 indirectly because when the device pins 14 are stopped, the device pins 12 are also stopped. In addition, by controlling the amount of insertion of device pins 12 and 14, the amount of compression of the pogo pins 42 by the device pins 12 and 14 is controlled.

Figure 4:
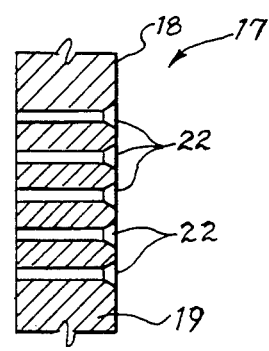
FIG. 4 is a cross sectional view of FIG. 2 taken along the line 4—4 which shows a plurality of apertures within an upper portion of the spring probe contactor for receiving device pins without the widened annular portion extending therefrom.

Referring to FIG. 4, a cross section of a plurality of the apertures 22 is shown. Note that no pogo pins 42 are shown in FIG. 4 for simplicity. The plate 19 of the spring probe contactor 17 is shown to have portions of the apertures 22 therein. The apertures 22 are generally cylindrical in shape, however, they are not wide enough to accommodate the insertion of a standoff 16. Consequently, the apertures 22 are for receiving the device pins 12, and the cavities 24 are for receiving the device pins 14, but since the device pins 12 and 14 are both fixedly coupled to the PGA device 10, when the device pins 14 are stopped by the standoffs 16 making contact with the bottom of the upper cylindrical portion of the cavities 24, the device pins 12 are also stopped, thereby limiting the compression of all of the pogo pins 42.

Referring to FIG. 5, a portion of the spring probe contactor 17 is shown. Each of the plates 19 and 40 are made out of an electrically non-conductive material such as plastic. Plate 38 is made out of brass, and within the plate 38, each pogo pin 42 is isolated from the other pogo pins 42 by an air space 43 and by two insulating washers 44. The apertures 22 and the cavities 24 are machined into each of the plates 19, 38, and 40. The length of the first depth 26 is calculated and then machined, based on the distance between the standoff 16 and the distal end 15 of each of the device pins 14, in order to limit the compression of the pogo pins 42 to less than 75% compression of a fully compressed pogo pin 42. The plate 19 is coupled to the plate 38 with a plurality of bolts 34 (only one shown in FIG. 5). The plate 38 is coupled to the plate 40 with a plurality of bolts 36 (only one shown in FIG. 5). Alternatively, the plate 40 can be directly coupled to the DUT board 46, and then the plate 40 is placed on top of the plate 38 and coupled thereto.

Figure 6:
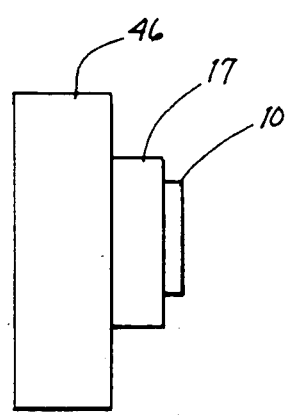
FIG. 6 is a side elevational view depicting the relative spatial relationship between the PGA device, the spring probe contactor, and the DUT board.

Referring to FIG. 6, the PGA device 10 is shown coupled to the spring probe contactor 17 which is coupled to the DUT board 46. By machining the cavities 24 of the spring board contactor 17 in order to limit the compression of the pogo pins 42 to less than 75% of a fully compressed condition for a pogo pin 42, sufficient electrical contact is made between the pogo pins 42 and the device pins 12 and 14 in order to enable proper testing of the PGA device 10 while eliminating the occurrence of damage to the pogo pins 42 due to overcompression of the pogo pins 42.

OPERATION

The spring board contactor 17 is coupled to the DUT board 46 in a manner which is well known in the art, and the DUT board 46 is coupled to a testing machine. The PGA device 10 is aligned with the spring board contactor 17 such that when the device pins 12 and 14 of the PGA device 10 are inserted therein, the device pins 12 and 14 are inserted, respectively, into the apertures 22 and the cavities 24. Having been calculated and then machined, based on the distance between the standoff 16 and the distal end 15 of each of the device pins 14, the length of the first depth 26 of each cavity 24 in conjunction with the standoff 16 limits the compression of the pogo pins 42 to less than 75% compression of a fully compressed pogo pin 42.

While the invention has been particularly shown and described with reference to the preferred embodiments thereof, it will be understood by those skilled in the art that the foregoing and other changes in form and details may be made therein without departing from the spirit and scope of the invention. While four device pins 14 each having a standoff 16 and four corresponding cavities 24 are used, it will be understood by those skilled in the art that a single device pin 14 having a standoff 16 and a single cavity 24 can be implemented, if desired.

What is claimed is:

1. A spring probe contactor for testing PGA (Pin Grid Array) devices that limits compression of pogo pins within said spring probe contactor comprising, in combination:
    a PGA device having a plurality of device pin means extending therefrom for insertion into said spring probe contactor in order to test said PGA device, and having at least one device pin of said plurality of device pin means provided with a widened annular portion expanding from a portion of said one device pin;
    a surface of said spring probe contactor having an array of apertures for receiving each device pin of said plurality of device pin means of said PGA device in order to make contact with and compress said pogo pins; and
    retaining means coupled to said surface of said spring probe contactor and comprising a cavity which corresponds to and mates with said widened annular portion of said one device pin in order to limit an amount of insertion of said PGA device, thereby limiting said compression of said pogo pins.

2. The spring probe contactor of claim 1 wherein said PGA device is provided with said widened annular portion expanding from a portion of each of four device pins of said plurality of device pin means, said four device pins being located in proximity to each of four corners of said PGA device.

3. The spring probe contactor of claim 1 wherein said PGA device provides a fixed distance between said widened annular portion expanding from said portion of said one device pin and a distal end of said one device pin.

4. The spring probe contactor of claim 1 wherein said cavity comprising a first cylindrical portion defined by a first diameter and a first depth and comprising a second cylindrical portion defined by a second diameter and a second depth, said first cylindrical portion being above said second cylindrical portion, said first diameter being larger than said second diameter, and said first depth being smaller than said second depth.

5. The spring probe contactor of claim 4 wherein said first diameter and said first depth of said first cylindrical portion permit insertion of said widened annular portion of said one device pin and said distal end of said one device pin and said second diameter of said second cylindrical portion stops insertion of said widened annular portion of said one device pin and said distal end of said one device pin while said distal end of said one device pin extends into said second cylindrical portion in order to compress a pogo pin.

6. The spring probe contactor of claim 5 wherein said first depth of said first cylindrical portion is selected in order to limit said compression of said pogo pins to less than 75% of a fully compressed condition in order to eliminate the occurrence of damage to said pogo pins due to over compression of said pogo pins while ensuring sufficient electrical contact between said pogo pins and said plurality of device pin means in order to enable proper testing of said PGA device.

7. A method for testing PGA (Pin Grid Array) devices using a spring probe contactor that limits compression of pogo pins within said spring probe contactor comprising the steps of:
    inserting a PGA device having a plurality of device pin means extending therefrom into a plurality of apertures in said spring probe contactor in order to make contact with and compress said pogo pins for testing said PGA device, said PGA device having at least one device pin of said plurality of device pin means provided with a widened annular portion expanding from a portion of said one device pin;
    limiting said inserting of said PGA device with a cavity in said spring probe contactor, said cavity corresponding to and mating with said widened annular portion of said one device pin in order to suppress an amount of insertion of said PGA device, thereby limiting said compression of said pogo pins.

8. The method of claim 7 wherein said PGA device is provided with said widened annular portion expanding from a portion of each of four device pins of said plurality of device pin means, said four device pins being located in proximity to each of four corners of said PGA device.

9. The method of claim 7 wherein said PGA device provides a fixed distance between said widened annular portion expanding from said portion of said one device pin and a distal end of said one device pin.

10. The method of claim 7 wherein said cavity comprising a first cylindrical portion defined by a first diameter and a first depth and comprising a second cylindrical portion defined by a second diameter and a second depth, said first cylindrical portion being above said second cylindrical portion, said first diameter being larger than said second diameter, and said first depth being smaller than said second depth.

11. The method of claim 10 wherein said first diameter and said first depth of said first cylindrical portion permit insertion of said widened annular portion of said one device pin and said distal end of said one device pin and said second diameter of said second cylindrical portion stops insertion of said widened annular portion of said one device pin and said distal end of said one device pin while said distal end of said one device pin extends into said second cylindrical portion in order to compress a pogo pin.

12. The method of claim 11 wherein said first depth of said first cylindrical portion is selected in order to limit said compression of said pogo pins to less than 75% of a fully compressed condition in order to eliminate the occurrence of damage to said pogo pins due to over compression of said pogo pins while ensuring sufficient electrical contact between said pogo pins and said plurality of device pin means in order to enable proper testing of said PGA device.

13. A spring probe contactor for testing PGA devices that limits compression of pogo pins within said spring probe contactor comprising, in combination:
    a PGA device having a plurality of device pin means extending therefrom for insertion into said spring probe contactor in order to test said PGA device, and having each of four device pins of said plurality of device pin means providing a widened annular portion expanding from a portion of each of said four device pins, said four device pins being located in proximity to each of four corners of said PGA device, said PGA device providing a fixed distance between said widened annular portion expanding from said portion of each of said four device pins and a distal end of each of said four device pins;

a surface of said spring probe contactor having an array of apertures for receiving each device pin of said plurality of device pin means of said PGA device in order to make contact with and compress said pogo pins;

retaining means coupled to said surface of said spring probe contactor and comprising four cavities which correspond to and mate with said widened annular portion of said four device pins in order to limit an amount of insertion of said PGA device, thereby limiting said compression of said pogo pins;

said four cavities each comprising a first cylindrical portion defined by a first diameter and a first depth and comprising a second cylindrical portion defined by a second diameter and a second depth, said first cylindrical portion being above said second cylindrical portion, said first diameter being larger than said second diameter, said first depth being smaller than said second depth; and said first diameter and said first depth of said first cylindrical portion of each of said four cavities permit insertion of said widened annular portion and said distal end of each of said four device pins and said second diameter of said second cylindrical portion of each of said four cavities stops insertion of said widened annular portion and said distal end of each of said four device pins while said distal end of each of said four device pins extends into said second cylindrical portion in order to compress a pogo pin, said pogo pin being compressed less than 75% of a fully compressed condition for said pogo pin in order to eliminate the occurrence of damage to said pogo pins due to over compression of said pogo pins while ensuring sufficient electrical contact between said pogo pins and said plurality of device pin means in order to enable proper testing of said PGA device.

* * * * *